United States Patent
Flowers

(10) Patent No.: US 8,000,663 B2
(45) Date of Patent: Aug. 16, 2011

(54) MODE SHIFT CALIBRATION IN POWER AMPLIFIERS

(75) Inventor: Dale Flowers, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 918 days.

(21) Appl. No.: 11/877,955

(22) Filed: Oct. 24, 2007

(65) Prior Publication Data

US 2008/0146174 A1    Jun. 19, 2008

Related U.S. Application Data

(60) Provisional application No. 60/875,084, filed on Dec. 14, 2006.

(51) Int. Cl.
*H04B 1/04* (2006.01)

(52) U.S. Cl. .................. 455/127.1; 455/127.3

(58) Field of Classification Search .... 455/127.1–127.5; 375/295–296
See application file for complete search history.

(56) References Cited

U.S. PATENT DOCUMENTS

| | | | |
|---|---|---|---|
| 7,440,733 B2 * | 10/2008 | Maslennikov et al. .... | 455/114.3 |
| 2002/0013156 A1 | 1/2002 | Yamamoto et al. | |
| 2003/0026235 A1 | 2/2003 | Vayanos et al. | |
| 2005/0135502 A1 | 6/2005 | Zhang | |
| 2005/0206457 A1 | 9/2005 | Martin | |
| 2005/0227644 A1 * | 10/2005 | Maslennikov et al. .... | 455/127.1 |
| 2005/0245214 A1 * | 11/2005 | Nakamura et al. ......... | 455/127.3 |
| 2006/0046666 A1 | 3/2006 | Hara | |
| 2007/0066250 A1 * | 3/2007 | Takahashi et al. ......... | 455/127.1 |
| 2008/0175306 A1 * | 7/2008 | Matsuoka et al. ............ | 375/146 |
| 2010/0246462 A1 * | 9/2010 | Lindgren et al. ........... | 455/127.3 |

FOREIGN PATENT DOCUMENTS

EP    1 710 918    10/2006

OTHER PUBLICATIONS

Extended European Search Report dated Nov. 5, 2010.

* cited by examiner

*Primary Examiner* — Lana N Le
(74) *Attorney, Agent, or Firm* — Dickinson Wright PLLC

(57) ABSTRACT

Methods and apparatus for aligning output power levels of a transmitter having a power amplifier adapted to operate in first and second operational modes. According to an exemplary embodiment, the transmitter includes a power alignment circuit configured to execute a power alignment algorithm. The power alignment algorithm is operable to align an output power level of the power amplifier when configured in the first operational mode with an output power level of the power amplifier when configured in the second operational mode. When the power amplifier is switched from the first operational mode to the second operational mode, the power alignment circuit references a power table having power entries that ensure that the output power level in the second operational mode is aligned with the output power level in the first operational mode. So that power control tolerances are satisfied for changes in power levels before and after a mode switch, one or more additional power control settings can be inserted in the power table.

26 Claims, 10 Drawing Sheets

Step size for individual power commands

| TPC_cmd | Transmitter power control range | | | | | |
|---|---|---|---|---|---|---|
| | 1 dB step size | | 2 dB step size | | 3 dB step size | |
| | Lower | Upper | Lower | Upper | Lower | Upper |
| 1 | +0.5 dB | +1.5 dB | +1 dB | +3 dB | +1.5 dB | +4.5 dB |
| 0 | -0.5 dB | +0.5 dB | -0.5 dB | +0.5 dB | -0.5 dB | +0.5 dB |
| -1 | -0.5 dB | -1.5 dB | -1 dB | -3 dB | -1.5 dB | -4.5 dB |

FIGURE 2 (Prior Art)

Net power change for groups of power commands

| TPC_cmd group | Transmitter power control range after 10 equal TPC_cmd groups | | | | Transmitter power control range after 7 equal TPC_cmd groups | |
|---|---|---|---|---|---|---|
| | 1 dB step size | | 2 dB step size | | 3 dB step size | |
| | Lower | Upper | Lower | Upper | Lower | Upper |
| +1 | +8 dB | +12 dB | +16 dB | +24 dB | +16 dB | +26 dB |
| 0 | +1 dB | +1 dB | -1 dB | +1 dB | -1 dB | +1 dB |
| -1 | -8 dB | -12 dB | -16 dB | -24 dB | -16 dB | -26 dB |
| 0,0,0,0,+1 | +6 dB | +14 dB | N/A | N/A | N/A | N/A |
| 0,0,0,0,-1 | -6 dB | -14 dB | N/A | N/A | N/A | N/A |

In this table, these requirements are the most restrictive (10 equal steps of 1 dB each must result in a net power difference of 10 ± 2 dB)

FIGURE 3 (Prior Art)

MODE SHIFT CALIBRATION IN POWER AMPLIFIERS

CROSS-REFERENCE TO RELATED APPLICATIONS

This application claims the benefit of U.S. Provisional Patent Application No. 60/875,084, filed on Dec. 14, 2006, the disclosure of which is hereby incorporated by reference.

FIELD OF THE INVENTION

The present invention relates to wireless communications transmitters. More specifically, the present invention relates to power control in communications transmitters.

BACKGROUND OF THE INVENTION

Cellular telecommunications technologies continue to evolve to satisfy consumer demand for fast and reliable mobile communications. First generation (1G) analog communications systems have been superseded by second generation (2G) digital communications systems, such as the Global System for Mobile Communications (GSM) system. In the last several years these 2G systems have been enhanced by the introduction of General Packet Radio Service (GPRS) and Enhanced Data Rates for GSM Evolution (EDGE) wireless services (often referred to as 2.5 G and 2.75 G systems), which provide users not only with voice communication capabilities but also data communication capabilities. Currently, a third generation (3G) system known as the Universal Mobile Telecommunications System (UMTS), which employs the Wide-Band Code Division Multiple Access (W-CDMA) wireless service, is being implemented in many parts of the World, to provide even faster and more reliable voice and data communications.

While advances in cellular telecommunications systems have benefited consumers, the realization of higher data throughput and the increasing need for efficient use of available radio frequency (RF) spectra has led to more stringent telecommunications standards. These more stringent standards require handset manufacturers to provide solutions that operate according to more complex modulation schemes and enhanced power control conditions. For example, whereas GSM uses a constant envelope modulation scheme, EDGE and W-CDMA technologies employ more sophisticated non-constant envelope signals. EDGE and W-CDMA also require that the RF transmitter of a mobile terminal to control its output power over a wide dynamic range. Specifically, the EDGE standard requires a transmitter to have the ability of controlling output power over a 30 dB range, while the W-CDMA standard requires a transmitter to have the ability of controlling output power over an 80 dB range.

The wide dynamic range in output power control specified by the W-CDMA standard results from the fact that the W-CDMA wireless interface utilizes the direct sequence CDMA (Code Division Multiple Access) signaling method. All mobile terminals share the same radio resource in CDMA-based systems. Consequently, it is important that each physical channel between a base station and a mobile terminal not use more power than necessary. To accomplish this level of power control, W-CDMA systems use a transmit power control (TPC) mechanism, in which base stations in the network transmit TPC commands to mobile terminals in a downlink (DL) direction. The TPC commands require the mobile terminals to increase or decrease their transmission power levels in the uplink (UL) direction in increments (e.g., +/−1, 2, 3, etc. decibel (dB) increments), so that system power use is managed and maintained at acceptable levels.

Wide dynamic range in output power is difficult to achieve in conventional RF transmitters (e.g., those based upon quadrature modulators). The difficulty derives from the requirement that the power amplifier (PA) used in such transmitters operate with high linearity, so as to prevent, for example, spectral re-growth and unwanted adjacent channel interferers. The linearity requirement becomes especially problematic when non-constant envelope signaling schemes, such as EDGE and W-CDMA are used, since the drive levels to the PA must be reduced to avoid signal distortion caused by clipping of signal peaks. Additional linearization resources must also be provided to ensure signal integrity. Unfortunately, the immediate consequence of these efforts to preserve linearity is an overall reduction in power efficiency.

A polar modulation transmitter is an alternative approach that avoids the problems associated with the conventional quadrature-modulator-based transmitter. As explained below, the polar modulation transmitter is energy efficient, since the PA is not required to operate with high linearity, and is capable of controlling output power over a wide dynamic range.

FIG. 1 is an architectural diagram of a typical polar modulation transmitter 100. As shown, the polar modulation transmitter 100 comprises a polar signal generation circuit 102, an amplitude control circuit 104, a PA 106, an antenna 108, and a phase modulated signal generation circuit 110. In operation, the polar signal generation circuit 102 operates on an input signal to provide an envelope component signal containing amplitude information of the input signal and a constant-amplitude phase component signal containing phase information of the input signal. The envelope component signal is coupled to an input of the amplitude control circuit 104 along an amplitude path, and the constant-amplitude phase component signal is coupled to an input of the phase modulated signal generation circuit 110. The phase modulated signal generation circuit 110 is configured to receive the constant-amplitude phase component signal and generate a constant-amplitude phase-modulated RF drive signal, which is coupled to an RF input of the PA 106 along a phase path. The amplitude control circuit 104 is configured to receive the envelope component signal along the amplitude path and provide an amplitude modulated power supply voltage having a power level determined by a transmit power control signal coupled to a power control input of the amplitude control circuit 104. The amplitude modulated power supply voltage is coupled to a power supply port of the PA 106, which amplifies the constant-amplitude phase-modulated RF drive signal in the phase path according to the amplitude modulated power supply voltage, thereby providing a modulated RF output signal that is radiated by the antenna 108 to a system base station.

Because signal envelope variation and output power control in the polar modulation transmitter 100 are performed by varying the gain of the polar output stage 106, there is no need for RF circuit linearity, as there is in conventional transmitters. Both in-band and out-of-band output noise are also dramatically lower compared to output noise produced by conventional transmitters. Another benefit of the polar modulation transmitter 100 is that it is capable of controlling output power over a wide dynamic range. This is achieved by configuring the PA 106 to operate in compressed mode during times when a high transmission power is required, and switching to uncompressed mode during times when only a low transmission power is required. When configured in compressed mode the output power of the transmitter is controlled by the amplitude modulated power supply voltage applied to the collector (or drain) node of the PA 106, while the power of the constant-amplitude phase-modulated RF drive signal is kept constant. When configured in uncompressed mode, the output power of the PA 106 is controlled by varying the power of the phase-modulated RF drive signal, while the collector (or drain) node of the PA 106 is held constant.

Although the polar modulation transmitter 100 is fully capable of achieving a wide dynamic range in output power, even for W-CDMA applications where an 80 dB output power control range is required, drift in output power can make power control difficult. The Third Generation Partnership Project (3GPP), which is the standards body responsible for promulgating UMTS and W-CDMA standards, requires that TPC commands from a cellular network base station result in a mobile terminal increasing or decreasing its output power level in discrete steps (e.g., +/−1 dB, +/−2 dB, +/−3 dB, etc.). The UMTS standard also specifies that these power level steps be performed within certain specified tolerances. For example, as shown in the table in FIG. 2, a TPC command for a +/−1 dB step in output power level requires that the resulting output power be within +/−0.5 dB of the target output power. So, if a transmitter of a mobile terminal is operating at 0 dBm, and a TPC command of "1" is received, the transmitter of the mobile terminal must adjust its power so that it transmits within a range of +0.5 dBm and 1.5 dBm. Wider tolerances of +/−1 dB and +/−1.5 dB are permitted for larger step sizes of 2 and 3 dB. The 3GPP UMTS standard also imposes cumulative tolerances for groups of power commands, as shown in the table in FIG. 3. For example, ten equal TPC command groups of 1 dB step size each, requires that the resulting output power level be within +/−2 dB of the target output power level.

Inspection of the table in FIG. 2 reveals that the most restrictive step size tolerance for a single TPC command is for a TPC command directing a +/−1 dB step size (+/−0.5 dB tolerance is required). Unfortunately, this tolerance is not always easily satisfied by the polar modulation transmitter 100 in FIG. 1, during times when the power level step involves a mode switch from uncompressed mode to compressed mode. Ideally, the output power level following a mode switch from uncompressed mode to compressed mode is continuous. When the PA 106 is configured to operate in compressed mode, steps in power levels remain fairly accurate. However, as illustrated in FIG. 4, a discontinuity (or "gap") is observed in the output power curve near the region where a mode switch occurs. This discontinuity is caused by drift in operating characteristics of circuitry within the phase path of the transmitter and in the power amplifier, which can be sensitive to temperature, aging, load conditions, and voltage variations. It has been observed that in some circumstances the discontinuity between the compressed and uncompressed mode power level curves is large enough that the +/−0.5 dB tolerance for 1 dB power step size specified by the UMTS standard is not satisfied. It would be desirable, therefore, to have methods and apparatuses for aligning the power level curves for step sizes involving a mode switch in a polar modulation transmitter, so that the UMTS power control accuracy requirements are satisfied.

SUMMARY OF THE INVENTION

Methods and apparatus are disclosed for controlling the output power of a communications transmitter. An exemplary communications transmitter includes a power amplifier adapted to be configured in either a first operational mode or a second operational mode and a power alignment circuit coupled to the power amplifier. The power alignment circuit is operable to execute a power alignment algorithm, which aligns an output power level of the power amplifier when configured in the first operational mode with an output power level of the power amplifier when configured in the second operational mode. According to an exemplary embodiment, the power alignment circuit includes a detector that is selectively coupled to an output of the power amplifier. When coupled to the output of the amplifier, the detector measures a first output power level of the power amplifier when the power amplifier is configured to operate according to said first operational mode, and measures a second output power level of the power amplifier when the power amplifier is configured to operate according to the second operational mode. The power alignment algorithm uses the first and second measured output power levels to determine whether the power alignment circuit should configure the power amplifier to operate according to the first operational mode or the second operational mode. When the power amplifier is switched from the first operational mode to the second operational mode, the power alignment circuit references a power table having power entries that ensure that the output power level in the second operational mode is aligned with the output power level in the first operational mode.

An exemplary method of switching a transmitter operating in a first mode to operating in a second mode includes creating a power table having a plurality of power control settings used to configure the transmitter to provide different output power levels. An overlap region is defined within which the transmitter can be configured to provide the same output power level when configured in a first operational mode as is provided when configured in a second operational mode. If necessary, one or more additional power control settings are inserted in the power table for the second operational mode. In response to a power level change that results in an output power level of the power amplifier falling within the overlap region, one of the one or more additional power control settings is selected from the power table to switch the transmitter to operate according to the power level change in the second operational mode while satisfying a power control accuracy requirement.

Further aspects of the invention are described and claimed below, and a further understanding of the nature and advantages of the invention may be realized by reference to the remaining portions of the specification and the attached drawings.

BRIEF DESCRIPTION OF THE DRAWINGS

FIG. 2 is a table showing power control tolerances for various output power step size commands, according to the 3GPP UMTS standard;

FIG. 3 is a table showing cumulative power control tolerances for various groups of power commands, according to the 3GPP UMTS standard;

DETAILED DESCRIPTION

Figure 1:
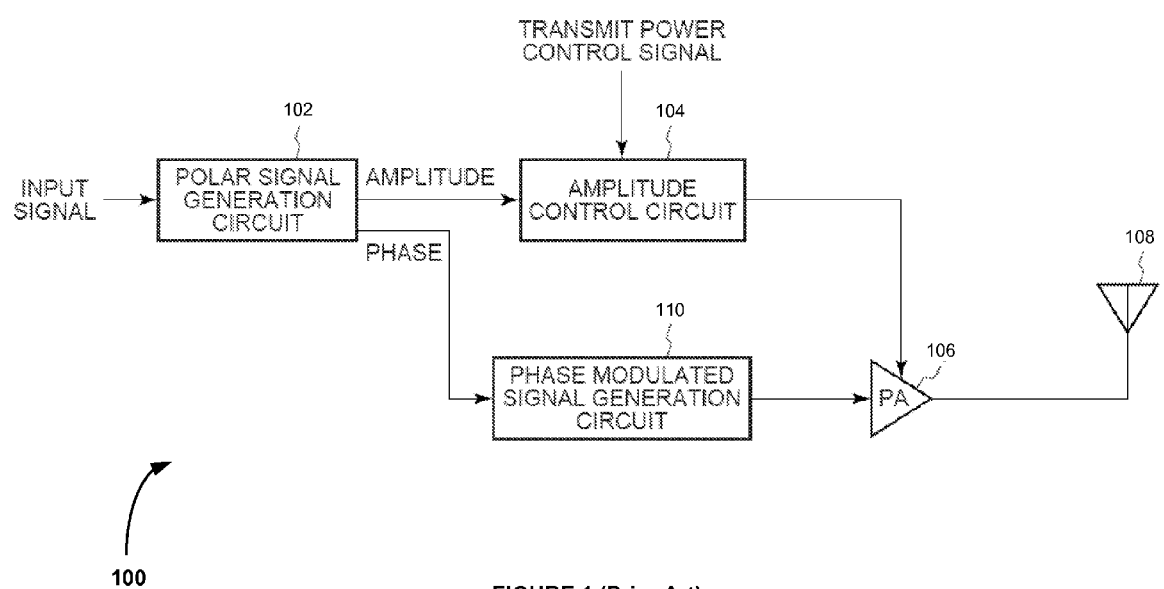
FIG. 1 is an architectural diagram of a typical polar modulation transmitter.
Figure 4:
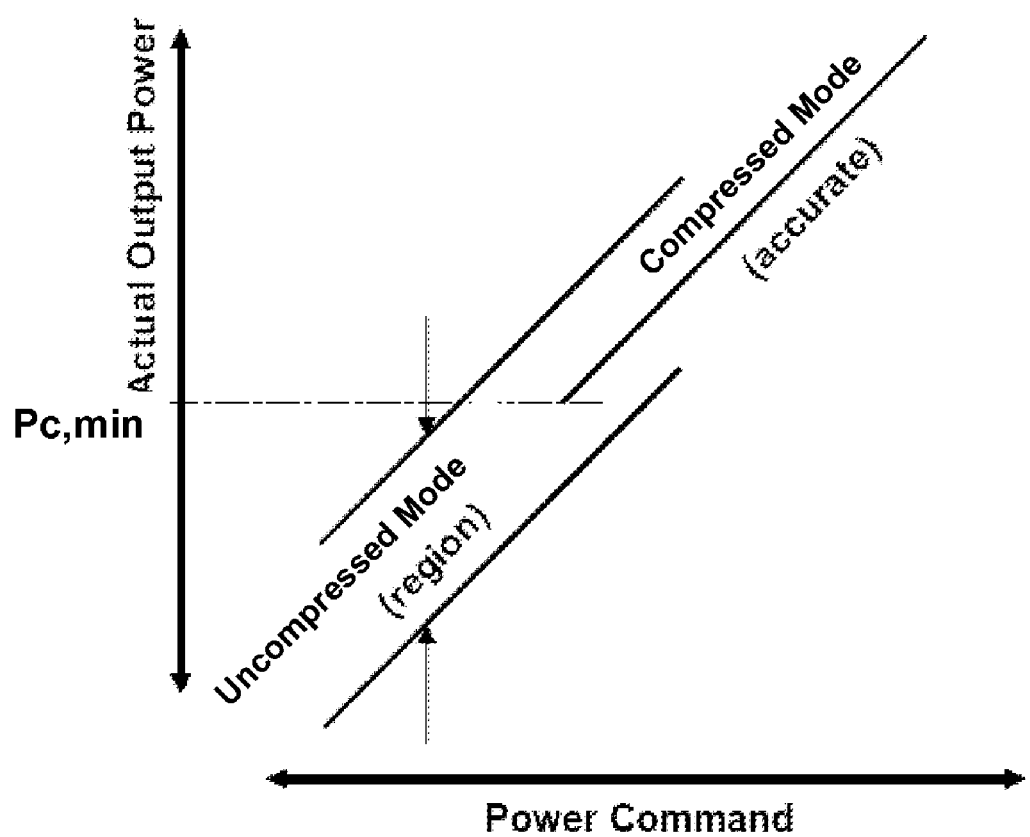
FIG. 4 is a graph illustrating how a discontinuity in output power level between compressed and uncompressed modes of the polar modulation transmitter in FIG. 1 may result due to drift in operating characteristics of circuitry within the phase path of the transmitter, and the power amplifier.
Figure 5:
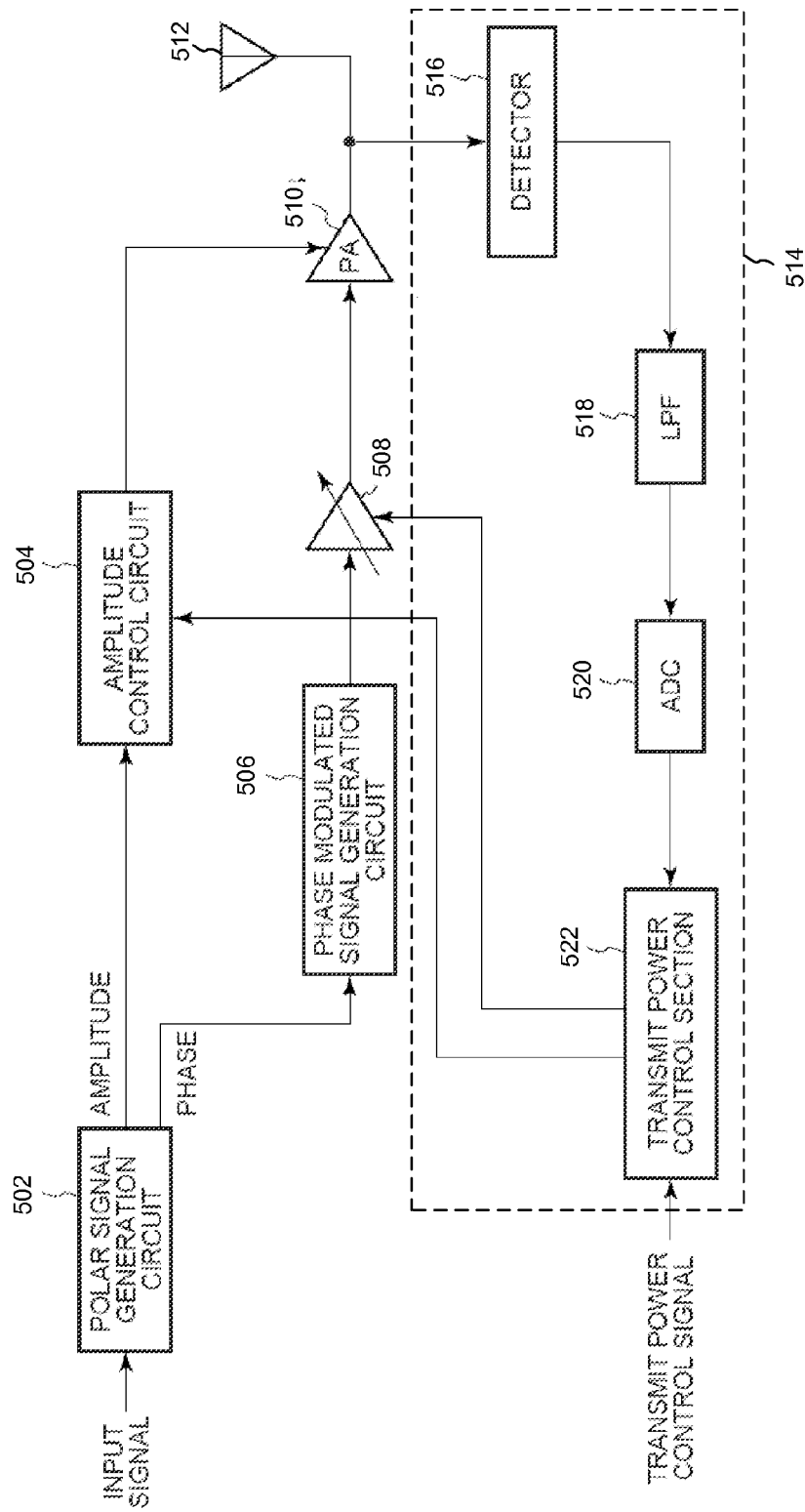
FIG. 5 is an architectural drawing of a polar modulation transmitter, according to an embodiment of the present invention.

FIG. 5 is an architectural drawing of a polar modulation transmitter 500, according to an embodiment of the present invention. The polar modulation transmitter 500 comprises a polar signal generation circuit 502, an amplitude control circuit 504, a phase modulated signal generation circuit 506, a variable gain amplifier (VGA) and/or attenuator 508 (referred to herein as "VGA/attenuator"), a power amplifier (PA) 510, an antenna 512, and a power alignment loop (PAL) 514. The PAL 514 comprises a power detector (e.g., a PIN diode or other semiconductor detector) 516 coupled to the RF output of the transmitter 500, a low-pass filter (LPF) 518, an analog to digital converter (ADC) 520, and a transmit power control section 522.

The polar signal generation circuit 502 of the polar modulation transmitter 500 operates on an input signal to provide an envelope component signal containing amplitude information of the input signal, and a constant-amplitude phase component signal containing phase information of the input signal. The envelope component signal is coupled to an input of the amplitude control circuit 504 along an amplitude path, and the constant-amplitude phase component signal is coupled to an input of the phase modulated signal generation circuit 506 along a phase path. The phase modulated signal generation circuit 506 is configured to receive the constant-amplitude phase component signal and generate a constant-amplitude phase-modulated RF signal, which is coupled to an input of the VGA/attenuator 508. The VGA/attenuator 508 either amplifies or attenuates the constant-amplitude phase-modulated RF signal, depending on a correction coefficient provided by the PAL 514, and couples the resulting scaled constant-amplitude phase-modulated RF signal to a drive input of the PA 510. At the same time, the amplitude control circuit adjusts the amplitude of the envelope signal, according to a scaling factor provided by the PAL 514, thereby providing an amplitude-varying supply voltage which is coupled to a power supply port of the PA 510. The PA 510 amplifies the scaled constant-amplitude phase-modulated RF signal applied to the drive input of the PA 510, depending on the scaling factor and correction coefficient provided to the amplitude control circuit 502 and the VGA/attenuator 508 from the transmit power control section 522.

In general, power control is achieved by the VGA/attenuator 508 in the phase path of the polar modulation transmitter 500, as well as by the amplitude control circuit 502 in the amplitude path. According to an embodiment of the invention, the PA 510 of the transmitter 500 is configured to operate in compressed mode during times when the transmit power is above a first predetermined threshold, and is configured to operate in uncompressed mode during times when the transmit power is below a second predetermined threshold.

Figure 6:
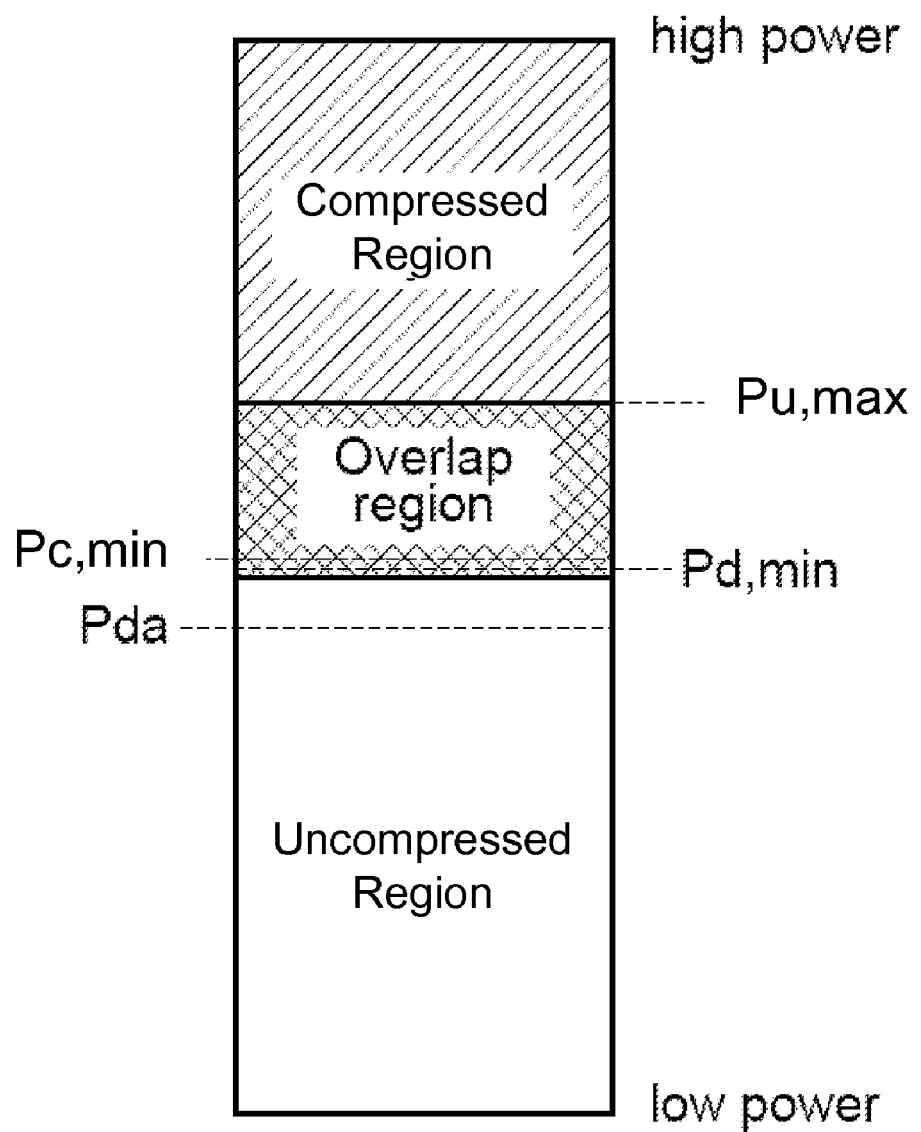
FIG. 6 is a diagram illustrating various regions of operation of the polar modulation transmitter in FIG. 5.

The compressed and uncompressed regions of operation are more clearly shown in FIG. 6. Pu,max corresponds to the aforementioned first predetermined threshold while Pc,min corresponds to the second predetermined threshold. The overlap region is a power level region in which the same output power can be achieved using either compressed mode or uncompressed mode. Pda represents the lowest uncompressed mode power level that, due to tolerances, may actually produce a power level in the overlap region. Pd,min is the lowest possible measured actual output power at power level Pc,min, and represents the lowest registered value corresponding to Pc,min due to imperfections in the detector PAL detector 516. According to one embodiment of the invention the boundaries of the overlap region are programmable. The programmability allows the polar modulation transmitter 500 to be adapted for operation in various wireless communications systems, and also affords the ability to accommodate PAs having different operating characteristics.

Figure 7:
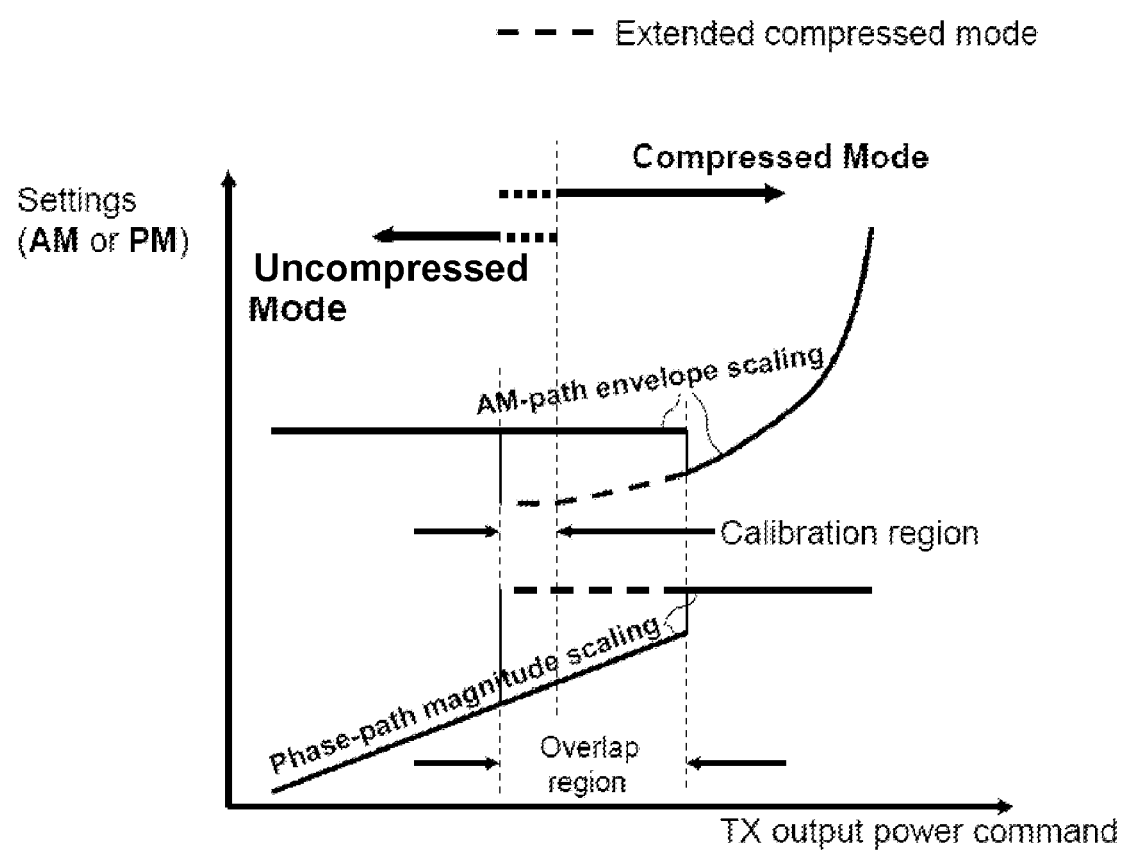
FIG. 7 is a graph illustrating amplitude path envelope scaling and phase path magnitude scaling settings as a function of output power when the power amplifier of the polar modulation transmitter in FIG. 5 is configured in the compressed, uncompressed and overlap regions.

FIG. 7 shows amplitude path envelope scaling and phase path magnitude scaling settings as a function of output power when the PA 510 of the polar modulation transmitter 500 is configured in the compressed, uncompressed and overlap regions. When the PA 510 is configured for operation in compressed mode (to the right of the right-most vertical dotted line), power control is achieved by scaling the amplitude path of the transmitter 500 while maintaining a constant amplitude phase path drive signal. When the PA 510 is configured to operate in uncompressed mode (to the left of the left-most vertical dotted line), power control is achieved by scaling the drive signal in the phase path while maintaining a constant scaling factor in the amplitude path.

Whether the PA 510 is configured to operate in compressed mode or uncompressed mode is application dependent. According to an exemplary embodiment adapted for W-CDMA operation, the lowest compressed mode power level (Pc,min) is specified as 0 dBm and the overlap region is 6 dB wide (+/−2 dB plus an additional 2 dB of margin). The calibration region refers to an output power range in which a mode switch between the compressed and uncompressed modes is effected.

During operation, the polar modulation transmitter 500 is commanded to lower and raise its output power to comply with network operating conditions. For example, as discussed above, in UMTS applications TPC commands require the transmitter to increase or decrease its output power in power increments (e.g., +/−1 dB, +/−2 dB, etc.). If a power level step increase ($\Delta P$) from a current power level within the uncompressed region results in an output power level that is still within the uncompressed region, the transmitter 500 simply retrieves the appropriate amplitude and/or phase path scaling factors from a power table memory, using the new power level as an address into the table. The transmit power control section 522 then applies the scaling factors to the amplitude control circuit and VGA/attenuator 508 to effect the power level change.

If the power level increase is so great that it causes a jump over the overlap region (i.e., from within the uncompressed region and into the compressed region), a mode switch is performed by retrieving the appropriate scaling factors for the amplitude and phase paths that will set the PA 510 at the new power level in the new mode. Because the output power level tolerances are wide for these large step sizes, no calibration between the two modes is required.

The situation is different when smaller step sizes are commanded, and the power level increase $\Delta P$ results in an output power level that falls within the overlap region. When this condition occurs, the PAL 514 of the polar modulation transmitter 500 is activated to determine whether a mode switch from uncompressed mode to compressed mode is required, and what steps must be performed to ensure that the resulting power level change satisfies specified output power level control tolerances.

As explained above, a discontinuity or gap may be observed between the output compressed mode and uncompressed mode power level curves, due to drift in operating characteristics of circuitry within the phase path of the transmitter. Unfortunately, this discontinuity can make it difficult to satisfy power control tolerances when a mode switch is performed for power levels in the overlap region. For example, the W-CDMA standard allow a tolerance of no greater than +/−0.5 dB tolerance for 1 dB power step sizes.

According to an embodiment of the invention, the PAL 514 is activated when a power level change results in a power level that falls within the overlap region, to ensure that power control tolerances specified by a wireless standard are complied with. More specifically, when a power level change results in a power level within the overlap region, the PAL 514 of the polar modulation transmitter 500 executes an algorithm that determines the scaling factor and/or correction coefficient required by the amplitude control circuit 504 and the VGA/attenuator 508 to provide the target output power level. The algorithm may be implemented as a state machine in one or more integrated circuits, which are either separate from or included with some or all of the other components of the polar modulation transmitter 500. The actual scaling factors and/or correction coefficients are stored in a table and are indexable by a power control signal received by the transmit power control section 522.

When the power level step $\Delta P$ raises the output power level from within the uncompressed mode region into the overlap region, the PAL 514 algorithm operates to determine the closest compressed mode power level that satisfies the applicable wireless standard power control accuracy specification, while maintaining the same VGA/attenuator 508 control settings. Additional power level entries in the power table may be necessary, however, to ensure that on the power control accuracy requirements.

Consider, for example, a W-CDMA system in which the transmitter 500 is commanded to change output power level by $\Delta P=1$ dB, and assume that the current output power level, Ptable, is set at a nominal level of −1 dBm and the lowest compressed mode power level is 0 dBm. With an allowable power control tolerance of +/−0.5 dB, this means that the output power level before the power level change may permissibly be anywhere within a range of −1.25 and −0.75 dBm. The $\Delta P=1$ dB increase in power level would result in an output power level of Ptable+$\Delta P$ being within the range of −0.25 and +0.25 dBm, as illustrated in the mode transition diagram presented in FIG. 8A. A mode switch to the closest available compressed mode power level of 0 dBm satisfies the +/−0.5 dB power control tolerance allowed by the W-CDMA specification, and even satisfies a more stringent maximum allowable step size error of +/−0.25 dB.

Unfortunately, a maximum allowable step size error of +/−0.25 dB cannot be satisfied for all power level transitions from uncompressed mode to compressed mode. Assume, for example, that the current uncompressed mode power level, Ptable, is at −0.7 dBm. A $\Delta P=+1$ dB power level step would result in an uncompressed mode power level of 0.3 dBm and a tolerance range of 0.3+/−0.5 dBm (i.e., −0.2 dBm to 0.8 dBm). With a maximum allowable step size error of +/−0.25 dB (specification is +/−0.5 dB), a transition to the closest compressed mode power level of 1 dBm would provide a power level range of 1+/−0.25 dBm (i.e., 0.75 dBm to +1.25 dBm). Such a mode transition would result in the upper end of the power level range being greater than the upper tolerance level of the −0.2 dBm to 0.8 dBm tolerance range. Hence, the power control tolerance of the W-CDMA specification would be violated if a mode switch to the compressed mode 1 dBm power level was permitted. A transition to the 0 dBm compressed mode power level (0+/−0.25 dBm or −0.25 dBm to +0.25 dBm) would also result in a violation of the specification since the lower end of the power level range would be less than the lower tolerance level of the −0.2 dBm to 0.8 dBm tolerance range.

In accordance with an embodiment of the present invention, extra compressed mode power levels are added to the power table, and made available for mode switches from uncompressed mode to compressed mode, so that the power control accuracies imposed by the wireless standard being used are satisfied. For example, compliance with the +/−0.5 dB power control accuracy requirement for 1 dB step sizes in the W-CDMA standard can be achieved by adding a 0.5 dBm power level to the compressed mode power levels and storing it in the power table. Compliance with the W-CDMA specification can be verified by considering the example above, where a 1 dB increase in power level is received and a mode switch from 0.3 dBm in uncompressed mode to the 0.5 dBm compressed mode power level is performed. As can be seen, the upper and lower power levels of the power level range (0.5 dBm+/−0.25 dB) are both within the −0.2 dBm to 0.8 dBm tolerance range. Compliance at other power levels can be confirmed, as will be readily appreciated by those of ordinary skill in the art.

Figure 8A:
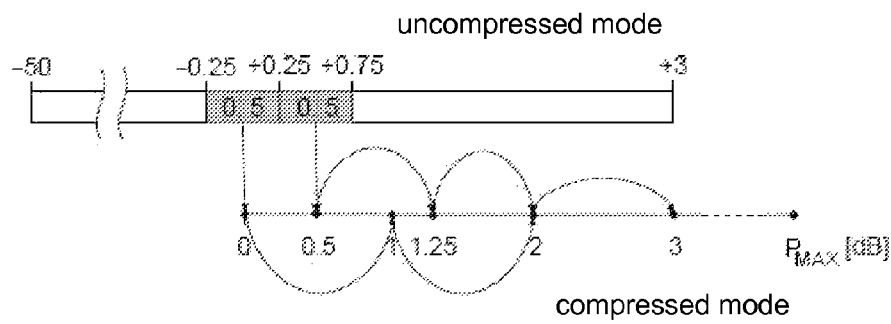
FIGS. 8A-C are mode switch diagrams, illustrating processes by which the power amplifier of the polar modulation transmitter in FIG. 5 is switched from uncompressed mode to compressed mode for power level step sizes of 1, 2 and 3 dB respectively.

Additional power level values may be added to the compressed mode power table, to ensure that the cumulative tolerances (see FIG. 3) are also satisfied. For example, as shown in FIG. 8A, a 1.25 dB level is included so that subsequent 1 dB power level commands would move from 0.5 dBm, then to 1.25 dBm, 2 dBm, and so on.

Figure 8B:
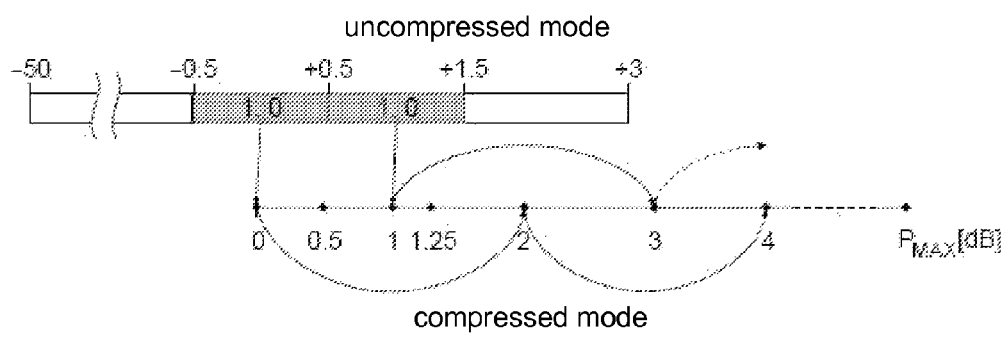
Figure 8C:
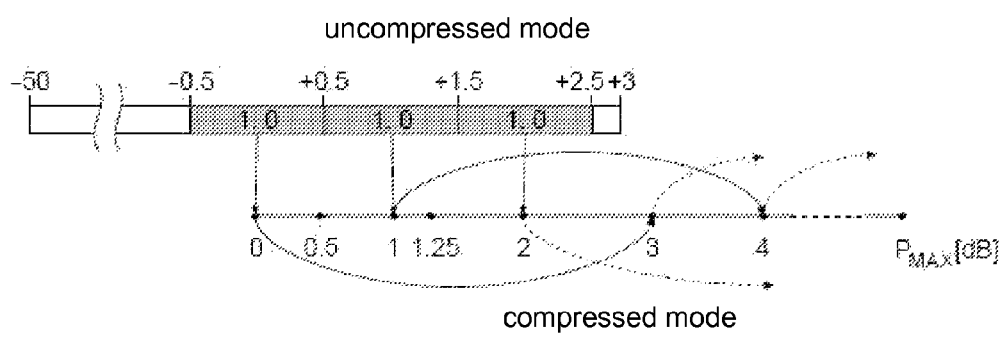

For larger power level step sizes, additional power table entries (0.25 dBm and 1.25 dBm in the example above) do not need to be entered in the power table, since the power control tolerances for larger step sizes are more relaxed. FIGS. 8B and 8C illustrate, for example, mode transitions from uncompressed mode to compressed mode when the transmitter 500 is commanded to increase its output power level by $\Delta P=2$ dB and $\Delta P=3$ dB. The power control tolerance for a 2 dB step size is +/−1 dB (see the table in FIG. 2), and is +/−2 dB for a 3 dB step size, both of which are wide enough to allow transitions to the existing compressed mode power levels while still satisfying a maximum step size error of +/−0.5 dB.

Figure 9A:
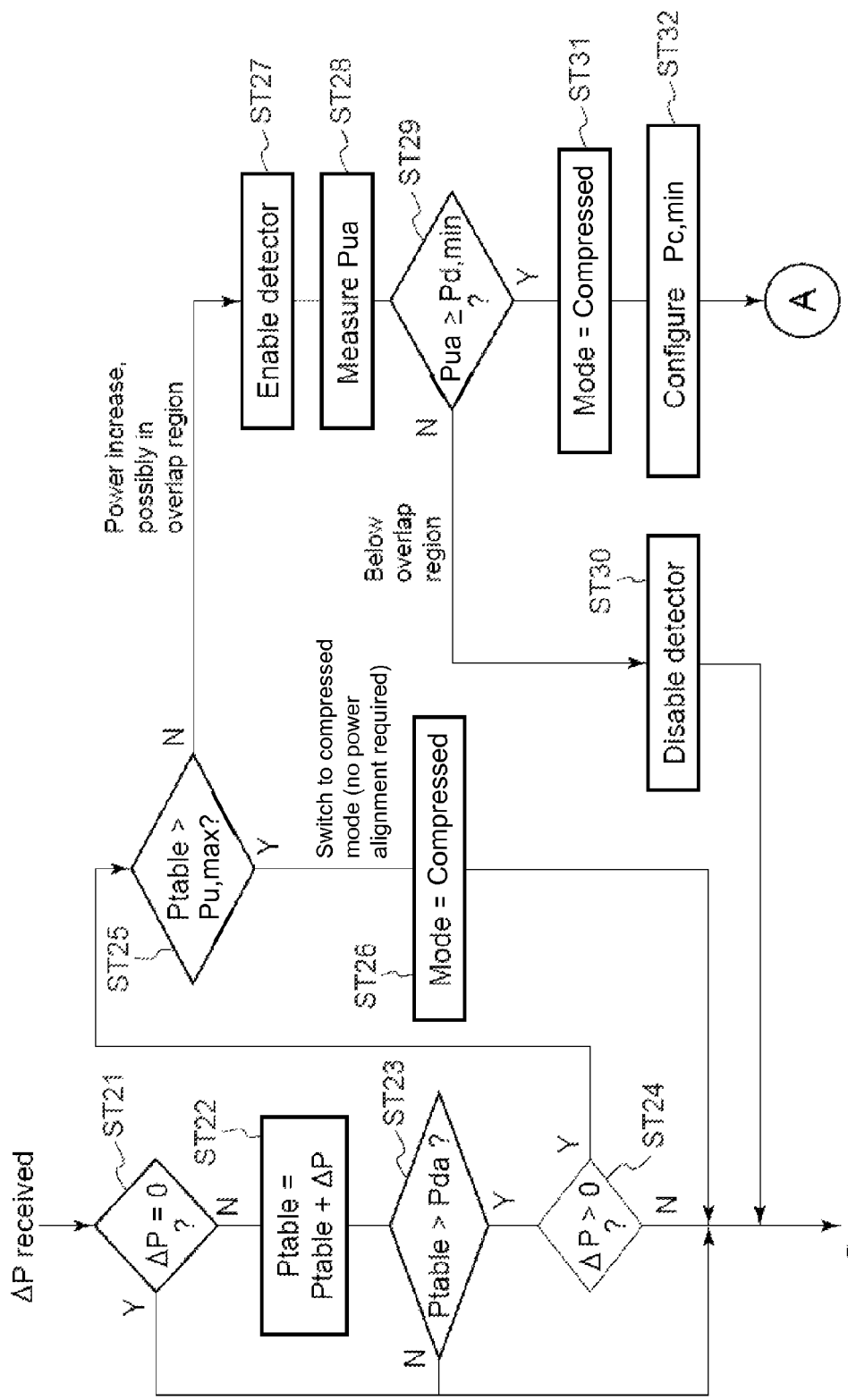
FIGS. 9A and B show a flowchart that illustrates operation of the polar modulation transmitter in FIG. 5 beginning with operation in uncompressed mode, including how the power alignment algorithm operates to perform a mode switch from uncompressed mode to compressed mode, in accordance with an embodiment of the present invention.
Figure 9B:
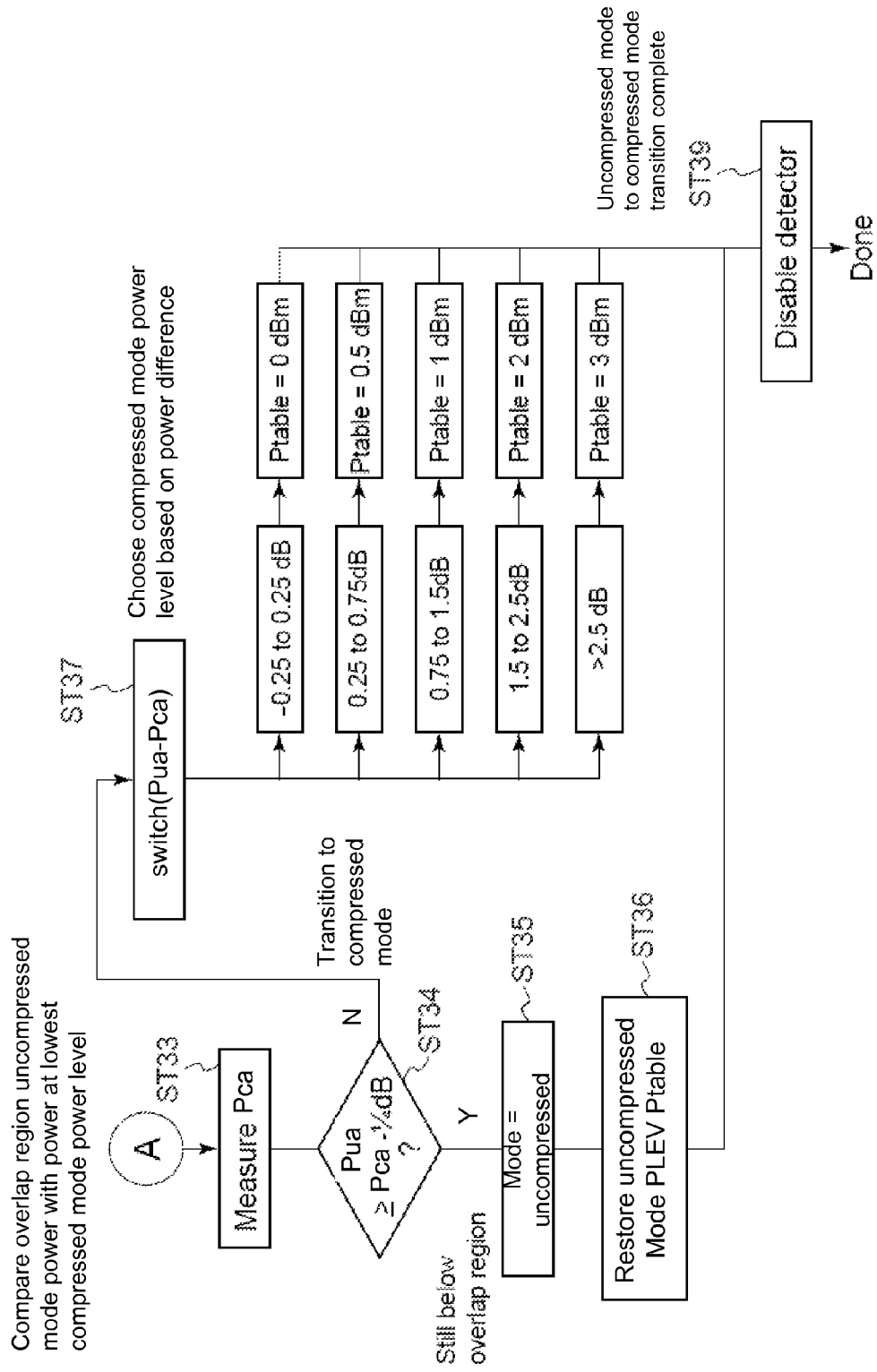

Referring now to FIGS. 9A and 9B, there is presented a flowchart further illustrating operation of the polar modulation transmitter 500 when the transmitter 500 is initially configured for operation in uncompressed mode. In response to receipt of a new power command $\Delta P$, at decision ST21 the transmission power controller determines whether $\Delta P$ is nonzero. If $\Delta P=0$, the transmitter 500 maintains operation in uncompressed mode at the new power level and the method ends until a new command to change power level is received. If $\Delta P \neq 0$, the power level is updated to a new power level, Ptable=Ptable+$\Delta P$. Next, at decision ST23 the transmission power control section 522 determines whether the new power level, Ptable=Ptable+$\Delta P$, falls within the uncompressed region. This operation is performed by comparing Ptable+$\Delta P$ to Pda, and determining whether Ptable+$\Delta P$ is greater than Pda. (As explained above, Pda corresponds to the lowest uncompressed mode power level that, due to tolerances, may produce a power level in the overlap region.) If Ptable+ΔP is determined not to be greater than Pda, the method ends and the transmitter 500 maintains uncompressed mode operation. On the other hand, if it is determined that Ptable+ΔP is greater than Pda, at decision ST24 the transmission power control section determines whether ΔP>0. If not, the method ends and the transmitter 500 maintains uncompressed mode operation.

If, however, it is determined at decision ST24 that ΔP>0, at decision ST25 it is determined whether Ptable+ΔP is greater than the maximum possible uncompressed mode power level, Pu,max. If yes, ΔP is so large that initiation of the PAL 514 is not necessary (i.e., no calibration is required), and at step ST26 the transmission power controller switches the polar modulation transmitter 500 to compressed mode.

On the other hand, if at decision ST25 it is determined that Ptable+ΔP is less than Pu,max, the result of the power increase ΔP may possibly result in a power level that falls within the overlap region. To determine whether the power increase ΔP results in a power level that falls within the overlap region, steps ST7-ST28 are performed. Specifically, at step ST27 the detector is enabled, at step ST28 the actual power level in uncompressed mode Pua is measured, and at decision ST29 it is determined whether the measured power level in uncompressed mode is greater than or equal to Pd,min, where Pd,min is the lowest registered value corresponding to Pc,min due to detector imperfections. If Pua is not greater than or equal to Pd,min, the detector is disabled at step ST30 the transmitter 500 maintains operation in uncompressed mode at the new power level setting and the method ends. However, if it is determined that Pua≧Pd,min, it is concluded that the Ptable+ΔP falls within the overlap region.

To determine whether a mode switch from uncompressed mode to compressed mode is required, the PAL algorithm determines whether the new power level Ptable+ΔP falls within the shaded regions in FIGS. 8A, 8B or 8C. To make this determination the transmit power control section 522 of the polar modulation transmitter 500 configures the PA 510 for operation in compressed mode at the lowest available output power level in compressed mode, as indicated in steps ST31 and ST32. Then, at step ST33 (see FIG. 9B), the actual output power in compressed mode (Pca) is measured by the PAL detector 516 and compared to the actual output power that was measured in step ST28. Next, at decision ST34 the PAL algorithm determines whether Pca−Pua is less than or equal to 0.25 dB. If Pca−Pua is less than or equal to 0.25 dB then no power alignment (i.e. calibration) between the uncompressed mode and compressed mode power levels is required. The drift in the uncompressed power mode curve is small enough that no power matching to the compressed mode power levels is required, and the precalibrated power table entries can be used. However, if Pca−Pua is determined to be greater than 0.25 dB, the misalignment is great enough that a power match to the closest compressed mode power levels is required. This is accomplished by making a mode switch to compressed mode at step ST37 and selecting the appropriate compressed mode power table entry, based on the power difference between Pua and Pca. Should the overlap region change due to device characteristic, the values in the 'switch' statement would also change to reflect the new overlap region. Once the calibration is completed, the detector 516 is disabled and the power modulation transmitter 500 continues to operate in the new compressed mode power level until a new power level change command is received.

While the above is a complete description of the preferred embodiments of the invention sufficiently detailed to enable those skilled in the art to build and implement the system, it should be understood that various changes, substitutions, and alterations may be made without departing from the spirit and scope of the invention as defined by the appended claims.

What is claimed is:

1. A method of controlling output power of a communications transmitter, comprising:
    defining an overlap power level region within which a power amplifier of the communications transmitter provides a same output power level in a first operational mode as it does when configured in a second operational mode; and
    in response to a power level command that results in an output power level of the power amplifier falling within the overlap power level region, determining whether to configure the power amplifier to operate according to the first or second operational mode, wherein:
    the communications transmitter uses either the first operational mode or the second operational mode in the overlap power level region.

2. The method of claim 1, further comprising using the power level command to reference a power table having settings that configure the power amplifier to provide the resulting output power level in the first operational mode.

3. The method of claim 2, further comprising:
    measuring the actual output power level of the power amplifier when configured in the first operational mode to provide the resulting output power level;
    switching the power amplifier to the second operational mode;
    measuring the actual output power level of the power amplifier when configured in the second operational mode; and
    using the difference in measured actual output power levels in the first and second operational modes to determine whether to set the power amplifier to operate according to the second operational mode.

4. The method of claim 3, further comprising matching the resulting output power level in the first operational mode to an available equivalent output power level in the second operational mode, if it is determined that the power amplifier should be set to operate according to the second operational mode.

5. The method of claim 4, further comprising including one or more additional power level entries in said power table if given a predetermined output power control tolerance, there are no equivalent output power level entries in the second operational mode that match the resulting output power level in the first operational mode.

6. The method of claim 5 wherein the additional power level entries have one or more corresponding power amplifier settings that configure the power amplifier to operate at the resulting output power level while satisfying the predetermined output power control tolerance.

7. The method of claim 1 wherein operation in the first operational mode comprises controlling the output power level of the power amplifier by varying a power level of a radio frequency (RF) signal applied to an RF input of the power amplifier.

8. The method of claim 7 wherein varying the power level of the RF signal is performed while maintaining a constant amplitude power supply setting at a power control input of the power amplifier.

9. The method of claim 1 wherein operation in the second operational mode comprises controlling the output power level of the power amplifier by varying the amplitude of a power supply applied to a power control input of the power amplifier.

10. The method of claim 9 wherein varying the amplitude of the power supply applied to the power control input of the power amplifier is performed while maintaining a constant RF input power at an RF input of the power amplifier.

11. The method of claim 1, wherein:
the first operational mode is either a compressed or an uncompressed operational mode of the power amplifier, and
the second operational mode is a different one of the compressed and uncompressed operational modes than the first operational mode.

12. A method of operating a communications transmitter, comprising:
configuring a transmitter to operate in a first operational mode;
determining whether to reconfigure said transmitter to operate in a second operational mode; and
if it is determined that said transmitter should be reconfigured to operate in the second operational mode, reconfiguring the transmitter to operate in said second operational mode, while ensuring that a change in output power level of the transmitter from the first operational mode to the second operational mode satisfies a predetermined power control tolerance, wherein:
the predetermined power control tolerance must be satisfied only when the transmitter operates in an overlap power level region of the first and second operational modes.

13. The method of claim 12 wherein configuring the transmitter to operate in the first operational mode comprises selecting a power level entry from a power table containing a first plurality of power level entries, said first plurality of power level entries defining a first plurality of output power levels at which the transmitter can be set when configured to operate in the first operational mode.

14. The method of claim 13 wherein the power table further includes a second plurality of power level entries defining a second plurality of output power levels at which the transmitter can be set when configured to operate in the second operational mode.

15. The method of claim 14 wherein the second plurality of power level entries includes at least one power level entry that ensures that said predetermined power control tolerance is satisfied when the transmitter is reconfigured to operate in said second operational mode.

16. A communications transmitter, comprising:
a power amplifier adapted to be configured in a first operational mode or a second operational mode; and
a power alignment circuit coupled to said power amplifier, said power alignment circuit operable to execute a power alignment algorithm, which aligns an output power level of the power amplifier when configured in the first operational mode with an output power level of the power amplifier when configured in the second operational mode, wherein:
the output power level of the power amplifier is aligned in an overlap power level region of the first and second operational modes.

17. The communications transmitter of claim 16 wherein the power amplifier has a radio frequency (RF) input configured to receive an RF phase component signal along a phase path, said RF phase component signal containing phase information of a signal applied to an input of the transmitter, and wherein the power amplifier has a power supply input port configured to receive an envelope component signal along an amplitude path, said envelope component signal containing amplitude information of the input signal applied to the input of the transmitter.

18. The communications transmitter of claim 17, further comprising a variable gain amplifier (VGA) and/or attenuator configured within the phase path of the transmitter, said VGA and/or attenuator having an output coupled to the RF input of the power amplifier and one or more gain and/or attenuator control inputs configured to receive gain and/or attenuation signals computed by said power alignment algorithm.

19. The communications transmitter of claim 17, further comprising an amplitude control circuit configured within the amplitude path of the transmitter, said amplitude control circuit having an output coupled to the power supply input port of the power amplifier and a control port configured to receive a scaling factor from said power alignment circuit.

20. The communications transmitter of claim 16 wherein the power alignment circuit includes a detector coupled to an output of the power amplifier, said detector operable to measure a first output power level of the power amplifier when the power amplifier is configured to operate according to said first operational mode, and operable to measure a second output power level of the power amplifier when the power amplifier is configured to operate according to the second operational mode.

21. The communications transmitter of claim 20 wherein the power alignment algorithm is operable to use the first and second measured output power levels to determine whether the power alignment circuit should configure the power amplifier to operate according to the first operational mode or the second operational mode.

22. The communications transmitter of claim 21 wherein the power alignment circuit is configured to reference a power table having power entries that ensure a power control accuracy requirement is satisfied when the power amplifier is switched from the first operational mode to the second operational mode.

23. A method of switching a transmitter operating in a first mode to operating in a second mode, comprising:
creating a power table having a plurality of power control settings used to configure the transmitter to provide different output power levels;
defining an overlap power region within which the transmitter can be configured to provide a same output power level when configured in a first operational mode as is provided when configured in a second operational mode;
inserting one or more additional power control settings for said second operational mode in said power table, said one or more additional power control settings being selectable in response to a power level change, and having a value or values that allow a power control accuracy requirement to be satisfied when the power amplifier is switched from said first operational mode to said second operational mode; and
in response to a power level change that results in an output power level of the power amplifier falling within said overlap region, selecting one of said one or more additional power control settings from said power table to switch the transmitter to operate according to the power level change in said second operational mode while satisfying a power control accuracy requirement.

24. The method of claim 23, further comprising:
in response to the power level change, measuring an output power level of the transmitter when the transmitter is configured in the first operational mode;

switching the transmitter to operate in the second operational mode;

measuring the output power level of the transmitter when the transmitter is configured in the second operational mode; and using the measured output power levels to determine whether to set the transmitter in the first operational mode or the second operational mode.

25. A method of operating a communications transmitter, comprising:

configuring a transmitter to operate in a first operational mode;

receiving a power step command to change an output power level of the transmitter from a current power setting to a resulting power setting;

matching, for an overlap power level region of the first and second operational modes, the resulting power setting in the first operational mode to an equivalent resulting power setting for a second operational mode; and configuring the transmitter to operate in the second operational mode at the matched resulting power setting.

26. The method of claim 25 wherein matching the resulting power setting in the first operational mode to the equivalent resulting power setting for the second operational mode is performed in a manner that satisfies a power control tolerance requirement associated with the power step command.

* * * * *

UNITED STATES PATENT AND TRADEMARK OFFICE
CERTIFICATE OF CORRECTION

| | | |
|---|---|---|
| PATENT NO. | : 8,000,663 B2 | Page 1 of 1 |
| APPLICATION NO. | : 11/877955 | |
| DATED | : August 16, 2011 | |
| INVENTOR(S) | : Dale Flowers | |

It is certified that error appears in the above-identified patent and that said Letters Patent is hereby corrected as shown below:

Claim 5, column 10, line 44, incorrectly reads:

"or more additional power level entries in said power table if"

and should read:

"or more additional power level entries in said power table, if"

Signed and Sealed this
Twenty-eighth Day of February, 2012

David J. Kappos
*Director of the United States Patent and Trademark Office*